(12) United States Patent
Zhou

(10) Patent No.: US 10,177,145 B2
(45) Date of Patent: Jan. 8, 2019

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 14 days.

(21) Appl. No.: 15/721,295

(22) Filed: Sep. 29, 2017

(65) Prior Publication Data

US 2018/0096999 A1    Apr. 5, 2018

(30) Foreign Application Priority Data

Sep. 30, 2016  (CN) .......................... 2016 1 0876700

(51) Int. Cl.
*H01L 29/06* (2006.01)
*H01L 27/08* (2006.01)
(Continued)

(52) U.S. Cl.
CPC ...... *H01L 27/0886* (2013.01); *H01L 21/3065* (2013.01); *H01L 21/3086* (2013.01);
(Continued)

(58) Field of Classification Search
CPC ... H01L 29/06; H01L 29/064; H01L 29/0649; H01L 29/08; H01L 29/084;
(Continued)

(56) References Cited

U.S. PATENT DOCUMENTS 8,697,515 B2 * 4/2014 Yin .................. H01L 21/82382
257/E21.409
2014/0203376 A1   7/2014 Xie et al.
(Continued)

OTHER PUBLICATIONS

The European Patent Office (EPO) The Extended European Search Report for 17194073.7 dated Feb. 12, 2018 8 Pages.

*Primary Examiner* — Monica D Harrison
(74) *Attorney, Agent, or Firm* — Anova Law Group, PLLC

(57) ABSTRACT

A method for fabricating a semiconductor structure includes providing a substrate including a device region, an isolation region, and a transition region between the device region and the isolation region, forming a plurality of fin structures on the device region of the substrate, forming a plurality of dummy fin structures on the transition region of the substrate, and forming an isolation structure on the device region, the isolation region, and the transition region of the substrate. The isolation structure further covers a portion of sidewall surfaces of the fin structures and the dummy fin structures. Moreover, the method includes forming a plurality of semiconductor devices on the fin structures in the device region after forming the isolation structure.

20 Claims, 13 Drawing Sheets

(51) Int. Cl.
| | |
|---|---|
| *H01L 21/82* | (2006.01) |
| *H01L 27/088* | (2006.01) |
| *H01L 21/3065* | (2006.01) |
| *H01L 21/308* | (2006.01) |
| *H01L 21/311* | (2006.01) |
| *H01L 21/762* | (2006.01) |
| *H01L 21/8234* | (2006.01) |
| *H01L 27/02* | (2006.01) |
| *H01L 29/10* | (2006.01) |
| *H01L 29/66* | (2006.01) |
| *H01L 21/02* | (2006.01) |
| *H01L 21/027* | (2006.01) |
| *H01L 21/306* | (2006.01) |
| *H01L 29/08* | (2006.01) |

(52) U.S. Cl.
CPC .. *H01L 21/31111* (2013.01); *H01L 21/76224* (2013.01); *H01L 21/76232* (2013.01); *H01L 21/8234* (2013.01); *H01L 21/823431* (2013.01); *H01L 21/823481* (2013.01); *H01L 27/0207* (2013.01); *H01L 29/0649* (2013.01); *H01L 29/1037* (2013.01); *H01L 29/6681* (2013.01); *H01L 29/66545* (2013.01); *H01L 21/0214* (2013.01); *H01L 21/0273* (2013.01); *H01L 21/02164* (2013.01); *H01L 21/02271* (2013.01); *H01L 21/30604* (2013.01); *H01L 21/823437* (2013.01); *H01L 29/0847* (2013.01)

(58) Field of Classification Search
CPC ... H01L 29/0847; H01L 29/10; H01L 29/103; H01L 29/1037; H01L 29/66; H01L 29/665; H01L 29/6654; H01L 29/66545; H01L 27/02; H01L 27/02; H01L 27/0207; H01L 27/08; H01L 27/088; H01L 27/0886; H01L 21/02; H01L 21/027; H01L 21/0273; H01L 21/022; H01L 21/0227; H01L 21/02271; H01L 21/021; H01L 21/0214; H01L 21/82; H01L 21/823; H01L 21/8234; H01L 21/82348; H01L 21/823481; H01L 21/82343; H01L 21/823431; H01L 21/823437; H01L 21/30; H01L 21/306; H01L 21/306; H01L 21/30604; H01L 21/3065; H01L 21/308; H01L 21/3086; H01L 21/31; H01L 21/311; H01L 21/3111; H01L 21/31111
USPC .......................................................... 257/401
See application file for complete search history.

(56) References Cited

U.S. PATENT DOCUMENTS

| | | |
|---|---|---|
| 2015/0147874 A1 | 5/2015 | Huang et al. |
| 2015/0206759 A1 | 7/2015 | Tsao et al. |
| 2015/0311311 A1 | 10/2015 | Fumitake |
| 2016/0308027 A1* | 10/2016 | Chang ................ H01L 21/3086 |

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201610876700.6, filed on Sep. 30, 2016, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With rapid development of semiconductor fabrication technology, semiconductor devices are developed towards having higher component density and higher integration level. As the most fundamental semiconductor device, transistor is widely used in a variety of fields. Therefore, with the improvement of the component density and the integration level for semiconductor devices, the dimension of transistors also becomes smaller.

With a cross-type fin structure similar to the fin of a fish, fin field-effect transistor (Fin-FET) is able to improve the integration level of semiconductor devices. In addition, the gate structure of a Fin-FET may control the channel of the transistor from the two sides of the fin structure, and thus the ability to control the carriers in the channel of the transistor may be improved, which is conducive to reducing the leakage current.

In a Fin-FET, the width of the fin structure has significant impact on the channel length of the transistor. Further, the channel length is an important factor that determines the severeness of the short-channel effect in the transistor. Specifically, with the development of semiconductor fabrication technology, when the width of the fin structures in Fin-FETs becomes smaller, a slight variation in the width of the fin structures may easily lead to differential performance of the formed Fin-FETs.

In addition, the width of conventional fin structures may be non-uniform, which may further lead to inconsistent performance of the Fin-FETs. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method includes providing a substrate including a device region, an isolation region, and a transition region between the device region and the isolation region, forming a plurality of fin structures on the device region of the substrate, forming a plurality of dummy fin structures on the transition region of the substrate, and forming an isolation structure on the device region, the isolation region, and the transition region of the substrate. The isolation structure further covers a portion of sidewall surfaces of the fin structures and the dummy fin structures. Moreover, the method includes forming a plurality of semiconductor devices on the fin structures in the device region after forming the isolation structure.

Another aspect of the present disclosure provides a semiconductor structure. The semiconductor structure includes a substrate including a device region, an isolation region, and a transition region between the device region and the isolation region, a plurality of fin structures formed on the substrate in the device region of the substrate, a plurality of dummy fin structures formed on the substrate in the transition region of the substrate, and an isolation structure formed on the device region, the isolation region, and the transition region of the substrate. The isolation structure further covers a portion of sidewall surfaces of the fin structures and the dummy fin structures. The semiconductor structure also includes a plurality of semiconductor devices formed on the fin structures in the device regions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In certain semiconductor fabrication methods, inconsistent width of the fin structures may be generated with undesired performance of the formed semiconductor structures. Semiconductor structures may be formed by a cut-last process and a cut-first process of the fin structures.

In the cut-last process, the portion of the fin structures formed in the isolation region is removed after forming the initial isolation structure. Therefore, an isolation layer needs to be formed on the substrate of the isolation region after the portion of the fin structures formed in the isolation region is removed. However, during the formation of the isolation layer, the portion of the fin structures adjacent to the isolation region may be easily oxidized, leading to a reduced fin width.

In the cut-first process, when etching the initial substrate using a patterned layer as an etch mask, the patterned layer exposes the entire portion of the initial substrate in the isolation region. Because the portion of the initial substrate to be removed from the isolation region has a large area, a substantial amount of compound may be produced. Therefore, a relatively large amount of compound may adhere to the portion of the fin structures adjacent to the isolation region, leading to an increased fin width.

As described above, semiconductor structures fabricated by either the cut-last process or the cut-first process may all end up with nonuniform fin width for the formed fin structures, and thus the performance of the semiconductor structures may be affected.

In the following, examples of semiconductor fabrication methods will be provided to illustrate the reasons for the absence of uniformity of fin width in the formed semiconductor structures.

Figure 1:
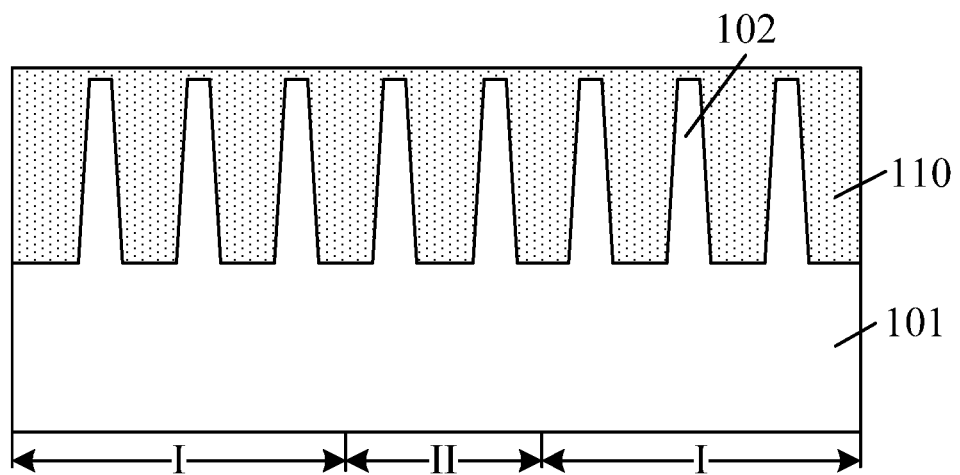
FIGS. 1-3 illustrate schematic cross-section views of semiconductor structures at certain stages of a fabrication method.
Figure 2:
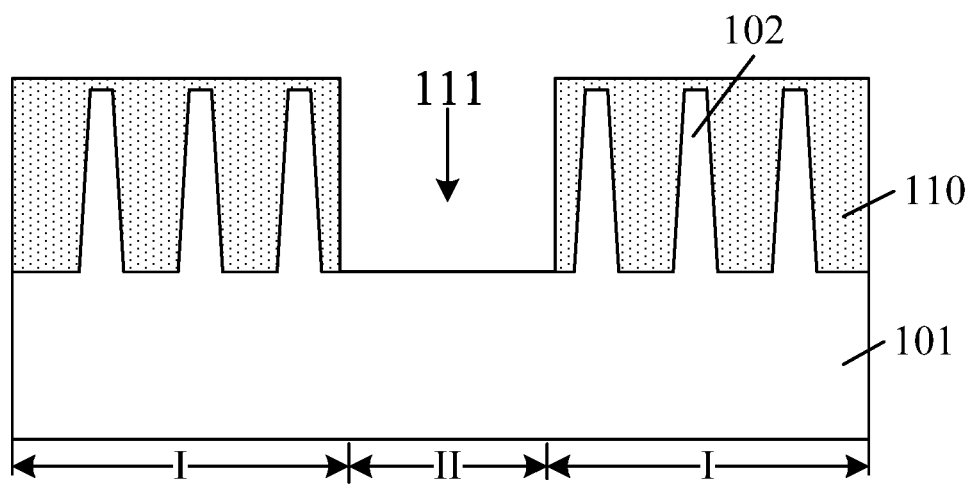
Figure 3:
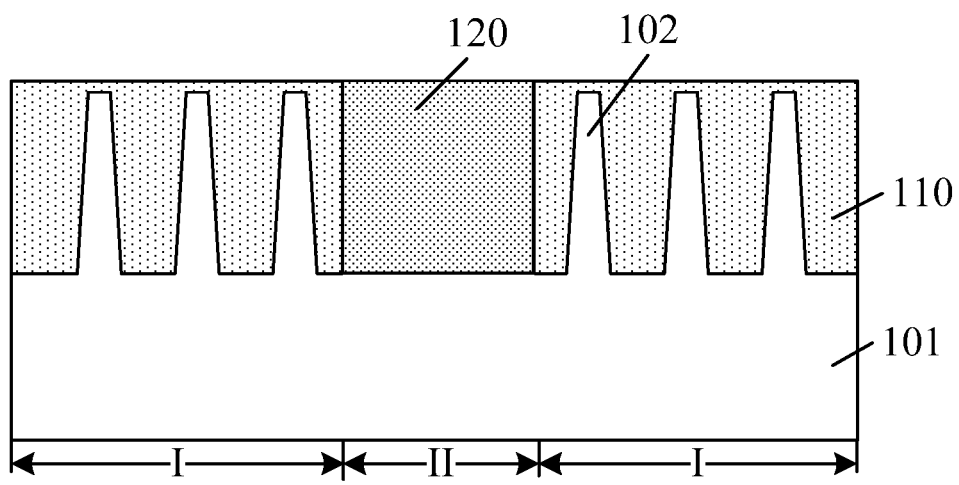

FIGS. 1-3 show schematic cross-section views of semiconductor structures at certain stages of a fabrication method.

Referring to FIG. 1, a base structure is provided. The base structure includes a substrate 101 and a plurality of fin structures 102 formed on the substrate 101. The base structure also includes a device region I and an isolation region II. The device region I includes two sub-regions separated by the isolation region II. A second initial isolation layer 110 is formed on the surface of the substrate 101. The second initial isolation layer 110 covers the sidewalls of the plurality of fin structures 102.

Referring to FIG. 2, the portion of each fin structure 102 as well as the portion of the second initial isolation layer 110 formed on the substrate 101 in the isolation region II are removed to form an initial trench 111.

Referring to FIG. 3, a first initial isolation layer 120 is formed to fill up the first initial trench 111.

Further, a second isolation layer is formed by etching the second initial isolation layer 110 to expose a portion of the sidewalls of each fin structure 102. In addition, the first initial isolation layer 120 is etched back to form a first isolation layer.

Further, a plurality of gate structures are formed across each fin structure 102 in the two sub-regions of the device region I. The plurality of gate structures cover a portion of the top and the sidewall surfaces of each fin structure 102. Moreover, source/drain regions are formed in the fin structure 102 on the two opposite sides of each gate structure.

During the etching process to remove the portion of the fin structures 102 and the second initial isolation layer 110 formed on the substrate 101 in the isolation region II, the sidewalls of the portion of the fin structures 102 adjacent to the isolation region II may be easily affected by the etch gas, and thus a surface portion of the sidewalls may be removed, leading to nonuniform fin width for the fin structures 102.

Moreover, the aspect ratio of the initial trench 111 is large. In order to ensure the formed first initial isolation layer 120 fully fill the initial trench 111, the first initial isolation layer 120 is formed by a process including fluid chemical vapor deposition. Specifically, during the fluid chemical vapor deposition (CVD) process to form the first initial layer 120, a precursor is used to fill the initial trench 111, and then the precursor is annealed to form the first initial isolation layer 120.

During the process to anneal the precursor, the gas with oxidation properties (such as water vapor, oxygen, etc.) in the precursor may easily penetrate through the sidewall of the initial trench 111 and thus enter the sidewall surfaces of the portion of the fin structures 102 adjacent to the initial trench 111. Under the high temperature condition during the annealing process, the gas with oxidation properties reacts with the portion of the fin structures 102 adjacent to the initial trench 111, causing oxidization of the sidewalls of the portion of the fin structures 102. Therefore, the width of the portion of the fin structures 102 adjacent to the initial trench 111 is reduced, and thus the fin width of the fin structures 102 in the semiconductor structure is not uniform.

Further, because of the nonuniform fin width of the fin structures 201 formed under the gate structures, the width of the channels in the formed transistor may also be nonuniform, and thus the performance of the formed semiconductor structure may be easily affected.

Figure 4:
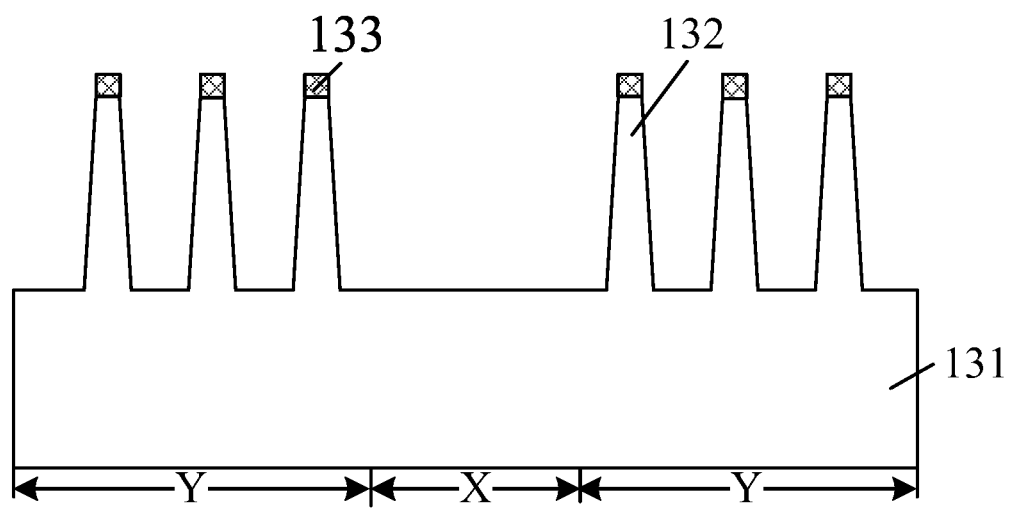
FIG. 4 illustrates a schematic cross-section view of a semiconductor structure fabricated by another method.

FIG. 4 shows a schematic cross-section view of a semiconductor structure fabricated by another method. Referring to FIG. 4, an initial substrate is provided. The initial substrate includes an isolation region X and a device region Y. The device region Y includes two sub-regions separated by the isolation region X. A photoresist layer 133 is then formed on the initial substrate. The photoresist layer exposes the entire portion of the initial substrate in the isolation region X and also a portion of the initial substrate in the device region Y. Further, an etching process using the photoresist layer 133 as an etch mask is performed to form a substrate 131 and a plurality of fin structures 132 on the substrate 131 in the two sub-regions of the device region Y.

During the process to etch the initial substrate, a large amount of the initial substrate in the isolation region X needs to be removed, and thus the amount of etching reactant required is also large. As a consequence, the amount of the compound produced during the process to etch the initial substrate in the isolation region X may also be substantial. Therefore, a substantial amount of the compound may cover the surface of the portion of the fin structures 132 adjacent to the isolation region X. When the compound covering the portion of the fin structures 132 adjacent to the isolation region X increases, the protection on the portion of the fin structures 132 adjacent to the isolation region X during the etching process may become stronger, and thus the etch rate on the portion of the fin structures 132 adjacent to the isolation region X may be reduced. Therefore, the fin width of the portion of the fin structures 132 adjacent to the isolation region X may become relatively large, leading to nonuniform width of the fin structures 132 in the formed semiconductor structure.

Figure 24:
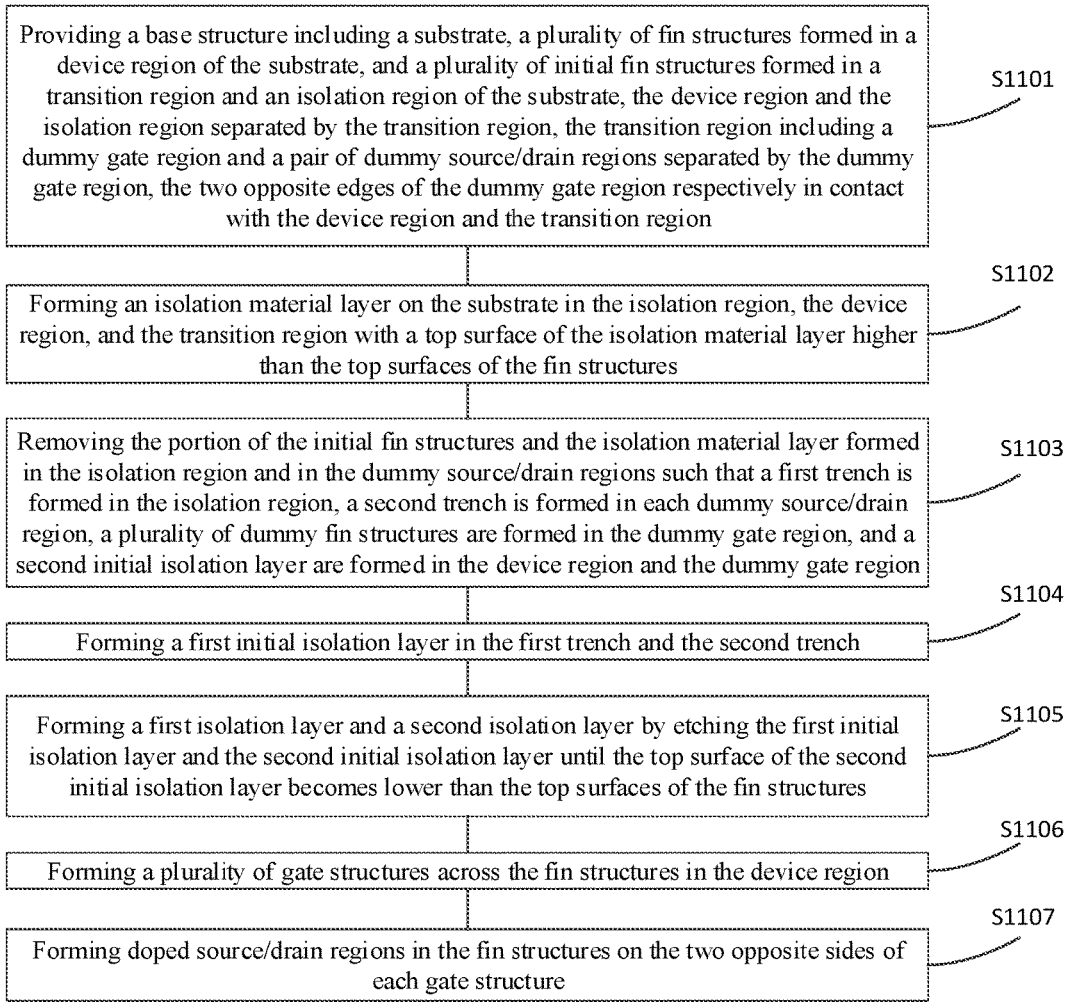
FIG. 24 illustrates a flowchart of an exemplary method for fabricating a semiconductor structure consistent with various disclosed embodiments in the present disclosure.

The present disclosure provides semiconductor structures and methods for fabricating the semiconductor structures. FIG. 24 shows a flowchart of an exemplary method for fabricating a semiconductor structure consistent with various disclosed embodiments in the present disclosure. FIGS. 5-17 show schematic cross-section views of semiconductor structures at certain stages of the exemplary method.

Figure 5:
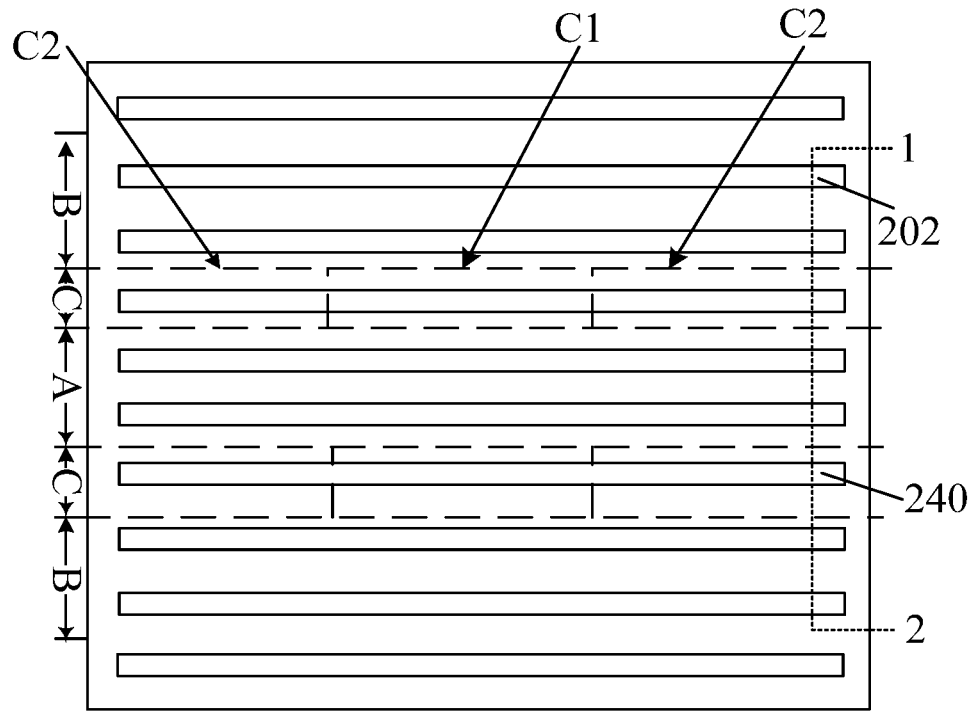
FIGS. 5-17 illustrate schematic cross-section views of semiconductor structures at certain stages of an exemplary fabrication method consistent with various disclosed embodiments in the present disclosure.
Figure 6:
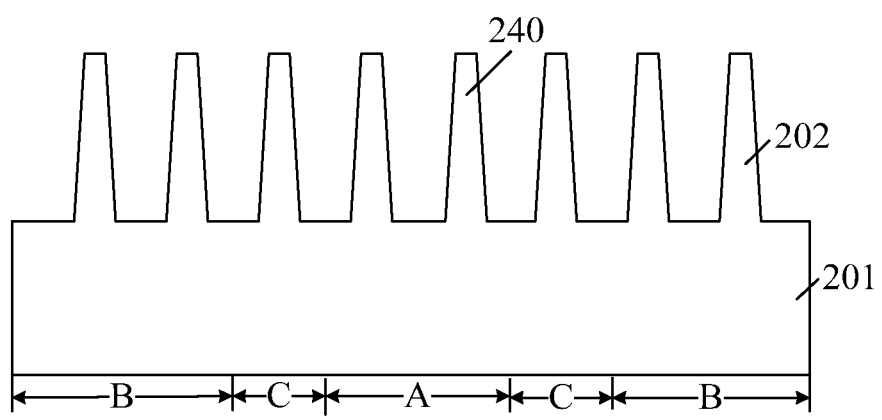

Referring to FIG. 24, at the beginning of the fabrication process, a base structure including a device region, an isolation region, and a transition region between the device region and the isolation region may be provided, and a plurality of fin structures may be formed on the substrate of the base structure (S1101). FIG. 5 shows a schematic top view of a corresponding semiconductor structure. FIG. 6 shows a schematic cross-section view of the semiconductor structure shown in FIG. 5 along line "1-2".

Referring to FIG. 5, a base structure may be formed. The base structure may include an isolation region A, a device region B, and a transition region C separating the isolation region A from the device region B. The base structure may also include a plurality of fin structures 202 formed on a substrate 201 in the device region B, and a plurality of initial fin structures 240 formed on the substrate 201 in the transition region C and the isolation region A.

In one embodiment, referring to FIG. 5, the device region B includes two discrete sub-regions, and the transition region C also includes two discrete sub-regions. In addition, each sub-region of the device region B is separated from the isolation region A by a sub-region of the transition region C. In other embodiments, the isolation region, the device region, and the transition region may each include a plurality of sub-regions as long as each sub-region of the device region is separated from the isolation region by the sub-regions of the transition region. In a specific embodiment, each of the isolation region, the device region, and the transition region may only include one sub-region.

In one embodiment, each sub-region of the transition region C may include a dummy gate region C1 and a pair of dummy source/drain regions C2 separated by the dummy gate region C1. The two side edges of the dummy gate region C1 may be in contact with the isolation region A and the device region B, respectively.

In one embodiment, the isolation region A may be used to electrically isolate neighboring sub-regions of the device region B. In addition, the transition region C may be used to electrically isolate the isolation region A from the device region B, and thus provide protection for the portion of the fin structures 202 formed in the device region B. Further, the dummy gate region C1 may be used to form a plurality of dummy gate structures in a subsequent process.

In one embodiment, the substrate 201, the plurality of fin structures 202, and the plurality of initial fin structures 240 may be made of a same material. For example, the substrate 201, the plurality of fin structures 202, and the plurality of initial fin structures 240 may be made of silicon. In other embodiments, the substrate, the fin structures, as well as the initial fin structures may also be made of germanium, SiGe, silicon on insulator (SOI), germanium on insulator (GOI), or any other appropriate semiconductor materials.

In one embodiment, the base structure may be formed by a process including the following steps. First, an initial substrate is provided. The initial substrate may then be patterned so that the substrate 201, the plurality of fin structures 202, and the plurality of initial fin structures 240 may be formed. The plurality of fin structures 202 may be formed on the substrate 201 in the device region B and the plurality of initial fin structures 240 may be formed on the substrate 201 in the isolation region A, the dummy gate region C1, and the dummy source/drain regions C2.

In one embodiment, the initial substrate may be patterned by a dry etching process. Specifically, the etching effect of the dry etching process may be isotropic, and thus the sidewall surfaces of the fin structures 202 and the initial fin structures 240 may be perpendicular to the substrate 201 as desired. In other embodiments, the initial substrate may be patterned by a wet etching process or by a process combining dry etching and wet etching.

In a subsequent process, the portion of the initial fin structures 240 formed on the substrate 201 in the isolation region A and the dummy source/drain regions C2 may be remove such that only the portion of the initial fin structures 240 formed on the substrate 201 in the dummy gate region C1 may be retained to form a plurality of dummy fin structures.

Figure 7:
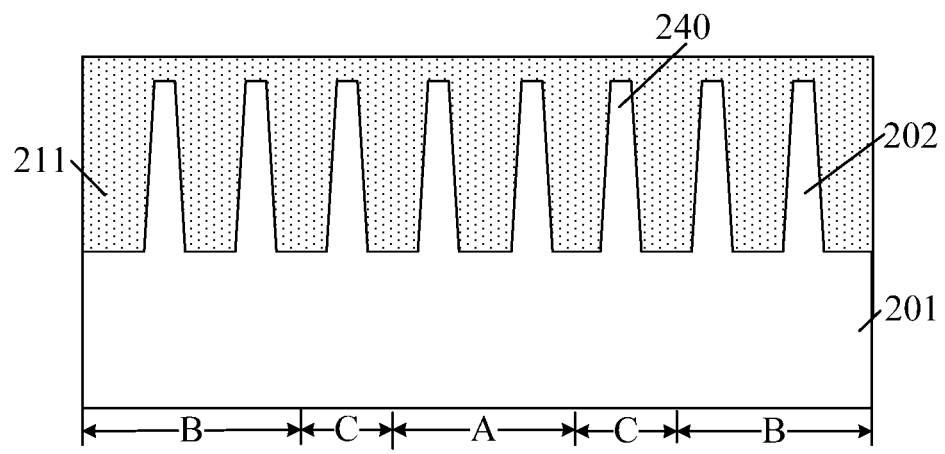

Further, returning to FIG. 24, an isolation material layer may be formed on the substrate in the isolation region, the device region, and the transition region with a top surface of the isolation material layer higher than the top surfaces of the plurality of fin structures (S1102). FIG. 7 shows a schematic cross-section view of a corresponding semiconductor structure.

Referring to FIG. 7, an isolation material layer 211 may be formed on the substrate 201 in the isolation region A, the device region B, and the transition region C. The top surface of the isolation material layer 211 may be higher than the top surfaces of the plurality of fin structures 202.

The isolation material layer 211 may be used to form a second isolation layer in a subsequent process. The second isolation layer may be used to electrically isolate the neighboring fin structures 202 in the device region B.

In one embodiment, the isolation material layer 211 may be made of $SiO_x$. In other embodiments, the isolation material layer may also be made of SiON.

In one embodiment, the isolation material layer 211 may be formed by a fluid CVD process. Specifically, the isolation material layer 211 formed by a fluid CVD process may demonstrate desired gap-filling ability such that the insulation property of the subsequently-formed second initial isolation layer may be desired.

Figure 8:
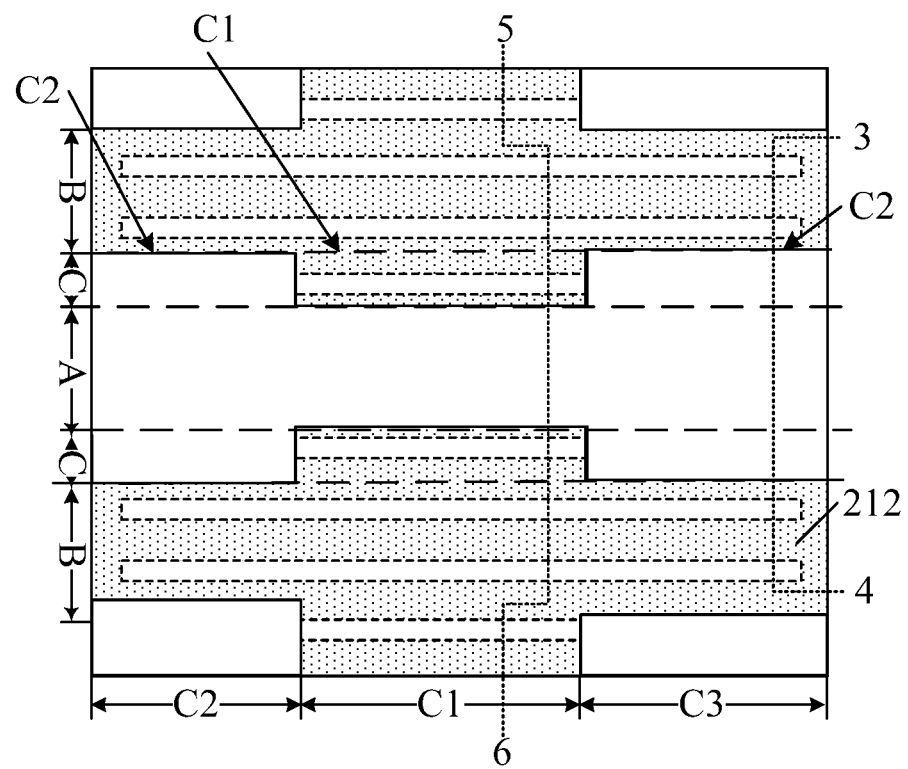
Figure 9:
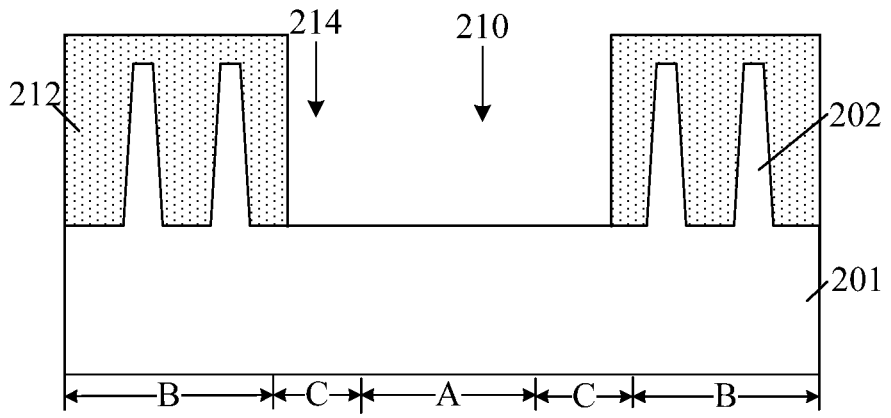

Further, returning to FIG. 24, the portion of the initial fin structures and the isolation material layer formed in the isolation region may be removed to form a first trench, the portion of the initial fin structures and the isolation material layer formed in each dummy source/drain region may be removed to form a second trench, and accordingly, the remaining portion of the initial fin structures in the dummy gate region may become a plurality of dummy fin structures, while the remaining portion of the isolation material layer in the dummy gate region and the device region may become a second initial isolation layer covering the fin structures and the dummy fin structures (S1103). FIG. 8 shows a schematic top view of a corresponding semiconductor structure. FIG. 9 shows a schematic cross-section view of the semiconductor structure shown in FIG. 8 along line "3-4", and FIG. 10 shows a schematic cross-section view of the semiconductor structure shown in FIG. 8 along line "5-6".

Figure 10:
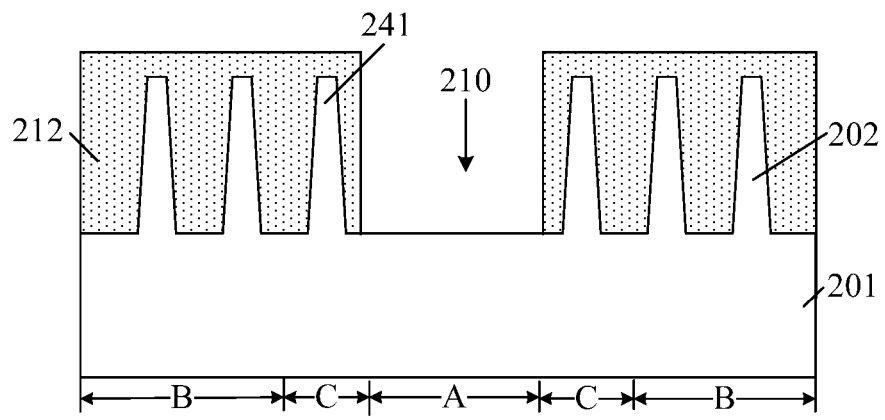

Referring to FIGS. 8-10, the portion of the initial fin structures 240 (referring to FIG. 7) and the portion of the isolation material layer 211 (referring to FIG. 7) formed in the isolation region A may be removed to form a first trench 210 in the isolation region A, while the portion of the initial fin structures 240 and the portion of the isolation material layer 211 formed in each dummy source/drain region C2 may be removed to form a second trench 214 in the corresponding dummy source/drain region C2. Accordingly, the remaining portion of the initial fin structures 240 formed in the dummy gate structure C1 may become a plurality of dummy fin structures 241. Moreover, the remaining portion of the isolation material layer 211 formed on the substrate 201 in the dummy gate region C1 and the device region B may become a second initial isolation layer 212 that covers the fin structures 202 and the dummy fin structures 241.

The first trench 210 and each second trench 214 may be filled with a first isolation layer in a subsequent process. The dummy fin structures 241 may be used to electrically isolate the fin structures in the device region B from the isolation region A. Moreover, the second initial isolation layer may be used to form a second isolation layer in a subsequent process.

In one embodiment, the dummy fin structures 241 may not be formed on the substrate 201 in the dummy source/drain regions C2, and thus further formation of transistors in the dummy source/drain regions C2 from the dummy fin structures 241 may be avoided. Therefore, the influence of the fin width of the dummy fin structures 241 on the performance of the formed semiconductor structure may be reduced.

In one embodiment, the plurality of fin structures 202 and the plurality of initial fin structures 240 may have a same height. The top surface of the isolation material layer 211 may be higher than the top surfaces of the plurality of initial fin structures 240.

In one embodiment, the process to remove the portion of the initial fin structures 240 and the isolation material layer 211 formed in the isolation region A and the dummy source/drain regions C2 may include the following steps. First, a patterned layer may be formed on the isolation material layer 211. The patterned layer may expose the surface of the portion of the isolation material layer 211 formed in the isolation region A and the dummy source/drain regions C2. Further, the isolation material layer 211 and the initial fin structures 240 may be etched using the patterned layer as an etch mask to form the first trench 210 and the second trench 214.

Moreover, because a plurality of initial fin structures 240 may be formed in the dummy gate region C1, during the etching process performed on the isolation material layer 211 and the plurality of initial fin structures 240, the portion of the initial fin structures 240 in the dummy gate region C1 may be able to prevent the etch gas from reaching the portion of the fin structures 202 formed in the device region B. Therefore, the width of the portion of the fin structures 202 adjacent to the dummy gate region C1 may not be easily reduced, and hence the uniformity of the width of the fin structures 202 may be ensured.

In one embodiment, the dummy fin structures 241 and the fin structures 202 may be made of a same material. For example, the dummy fin structures 241 and the fin structures 202 may both be made of silicon. In other embodiments, the dummy fin structures 241 may also be made of germanium, SiGe, or any other appropriate material.

In one embodiment, because the dummy fin structures 241 and the fin structures 202 are made of a same material, during the process to etch the initial fin structures 240, the dummy fin structures 241 may be able to react with the etching reactant so that the amount of the etching reactant reaching the fin structures 202 adjacent to the transition region C may be reduced. Therefore, reduction of the width of the fin structures 202 formed adjacent to the transition region C may be suppressed, ensuring the uniformity of the width of the fin structures 202.

In other embodiments, the fin structures and the dummy fin structures may also be made of different materials.

In one embodiment, the isolation material layer 211 and the initial fin structures 240 may be etched by a dry etching process. Specifically, the etching effect of the dry etching process is isotropic so that the damage to the sidewalls of the first trench 210 and the second trench 214 may be limited. In other embodiments, the isolation material layer and the initial fin structures may also be etched by a wet etching process or by a process combining dry etching and wet etching.

In one embodiment, each dummy fin structure 241 and each fin structure 202 may have an identical fin width. In other embodiments, the width of each dummy fin structure 241 and the width of each fin structure 202 may be different.

Figure 11:
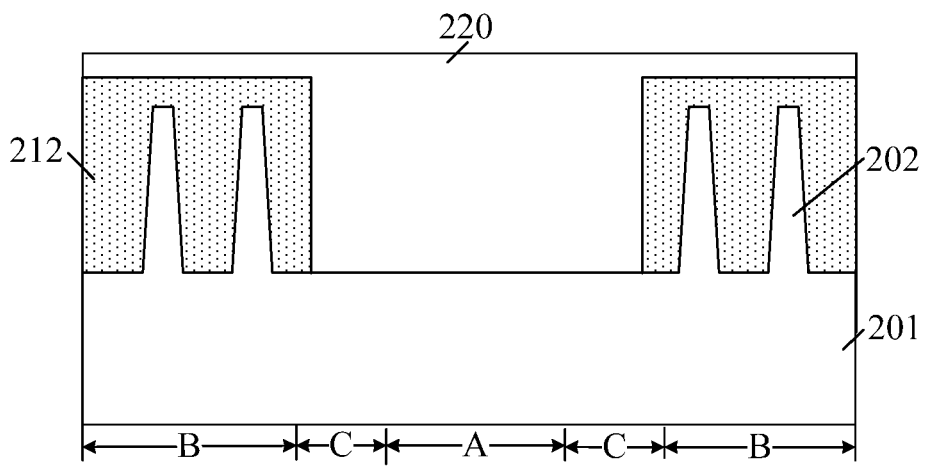

Returning to FIG. 24, further, a first initial isolation layer may be formed in the first trench and the second trench (S1104). FIG. 11 shows a schematic cross-section view of a corresponding semiconductor structure developed from the structure shown in FIG. 9 and FIG. 12 shows a schematic cross-section view of a corresponding semiconductor structure developed from the structure shown in FIG. 10.

Figure 12:
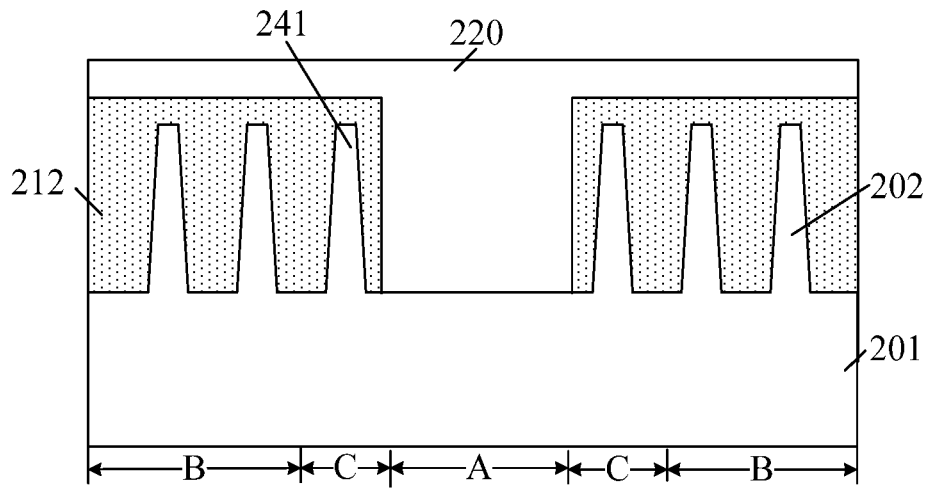

Referring to FIGS. 11-12, a first initial isolation layer 220 may be formed to fill the first trench 210 (referring to FIG. 10) and the second trench 214 (referring to FIG. 9). The first initial isolation layer 220 may be used to form a first isolation layer in a subsequent process.

In one embodiment, the first initial isolation layer 220 and the second initial isolation layer 212 may be made of a same material. For example, in one embodiment the first initial isolation layer 220 and the second initial isolation layer 212 may be made of $SiO_x$. In other embodiments, the first initial isolation layer may be made of SiON.

In one embodiment, the first initial isolation layer 220 and the second initial isolation layer 212 are made of a same material, and thus a single etching process may be performed to etch both the first initial isolation layer 220 and the second initial isolation layer 212. As such, the fabrication process may be simplified and the product yield may also be improved. In other embodiments, the second initial isolation layer and the first initial isolation layer may be made of different materials.

In one embodiment, the first initial isolation layer 220 may be formed by a fluid CVD process. For example, the fluid CVD process adapted to form the first initial isolation layer may include the following steps. First, a precursor may be formed in the first trench 210 and the second trench 214. The precursor may be a fluid so that the first trench 210 and the second trench 214 may be efficiently filled by the precursor. Then, an annealing process may be performed to activate the precursor and thus form the first initial isolation layer 220.

In one embodiment, the precursor may be a material containing carbon-hydrogen bonds, carbon-oxygen bonds, and nitrogen-silicon bonds. Moreover, the reactant used in the annealing process to anneal the precursor may be an oxygen-containing gas such as water vapor, oxygen gas, etc. During the annealing process, the oxygen atoms in the oxygen-containing gas may replace the nitrogen atoms and hydrogen atoms in the precursor, and form the first initial isolation layer 220.

Moreover, during the annealing process performed on the precursor, the oxygen-containing gas may easily diffuse. Because of the presence of the transition region C between the device region B and the isolation region A and the dummy fin structures 241 on the substrate 201 in the dummy gate region C1, the oxygen-containing gas may not be able to easily reach the fin structures 202 formed in the device region B due to the blocking effect of the dummy fin structures 241. Therefore, the uniformity of the width of the fin structures 202 in the device region B may be ensured, and thus the performance of the formed semiconductor structure may be improved.

The dummy fin structures 241 may be made of silicon. The dummy fin structures 241 may react with the oxygen-containing gas such that the amount of the oxygen-containing gas reaching the fin structures 202 in the device region B may be reduced. Therefore, reduction of the width of the fin structures 202 adjacent to the transition region C may be suppressed.

In one embodiment, the first initial isolation layer 220 may also be formed on the second initial isolation layer 212.

Figure 13:
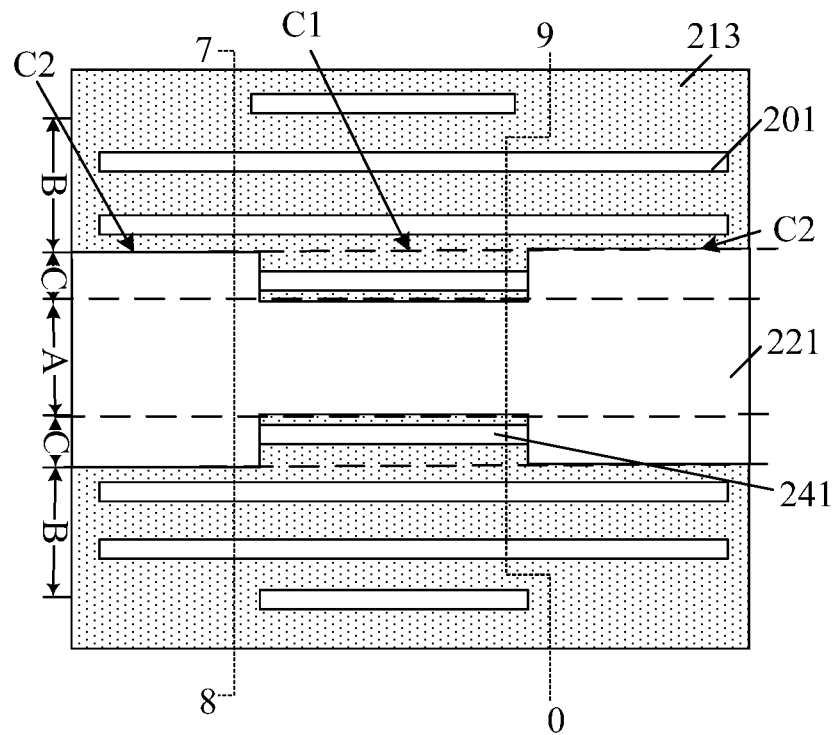
Figure 14:
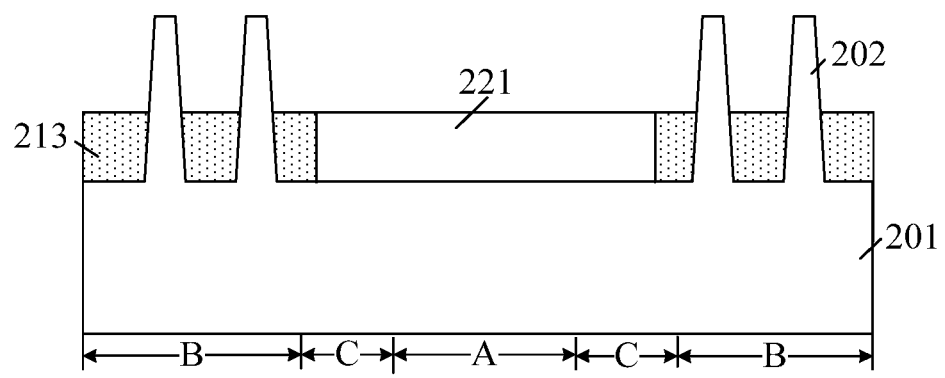

Further, referring to FIG. 24, a first isolation layer and a second isolation layer may be formed by etching the first initial isolation layer and the second initial isolation layer until the top surface of the second initial isolation layer becomes lower than the top surfaces of the fin structures (S1105). FIG. 13 shows a schematic top view of a corresponding semiconductor structure. FIG. 14 shows a schematic cross-section view of the semiconductor structure shown in FIG. 13 along line "7-8" and FIG. 15 shows a schematic cross-section view of the semiconductor structure shown in FIG. 13 along line "9-0".

Figure 15:
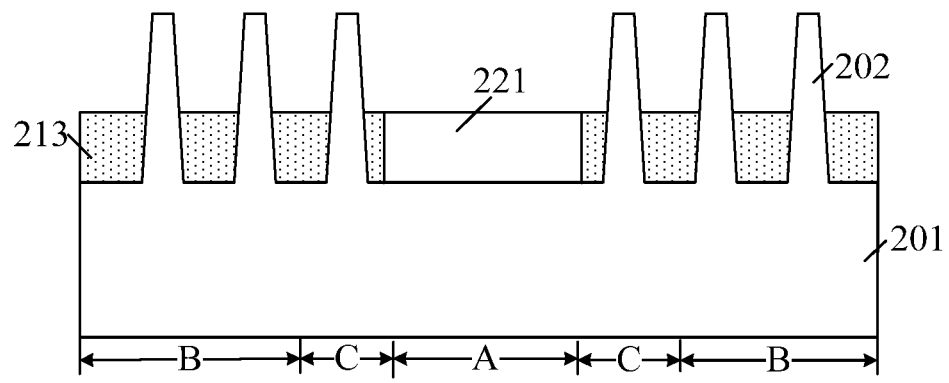

Referring to FIGS. 13-15, an etching process may be performed to etch the second initial isolation layer 212 (referring to FIG. 12) and the first initial isolation layer 220 (referring to FIG. 12). With the top surfaces of the first initial isolation layer 220 and the second initial isolation layer 212 become lower than the top surfaces of the fin structures 202, a first isolation layer 221 and a second isolation layer 213 may be formed.

The second isolation layer 213 may be used to electrically isolate neighboring fin structures 202 and the first isolation layer 221 may be used to electrically isolate different sub-regions of the device region B. In one embodiment, the first isolation layer 221 and the second isolation layer 213 may together form an isolation structure.

In one embodiment, because the first initial isolation layer 220 may also formed on the second initial isolation layer 212, prior to etching the second initial isolation layer 212 and the first initial isolation layer 220, the fabrication process may also include removing the portion of the first initial isolation layer 220 formed on the second initial isolation layer 212.

In one embodiment, the portion of the first initial isolation layer 220 formed on the second initial isolation layer 212 may be removed by a chemical mechanical polishing process, a dry etching process, or a wet etching process.

In one embodiment, the process to etch the second initial isolation layer 212 and the first initial isolation layer 220 may include dry etching or wet etching.

Further, in one embodiment, after forming the isolation material layer 211 (referring to FIG. 9), the portion of the initial fin structures 212 formed in the isolation region A may be removed. Moreover, the first isolation layer 221 may then be formed in the first trench 210 and the second trench 214. As such, the thickness of the formed first isolation layer 221 may be uniform. Therefore, the isolation properties of the first isolation layer 221 may be ensured, and the performance of the formed semiconductor device may be improved.

Figure 16:
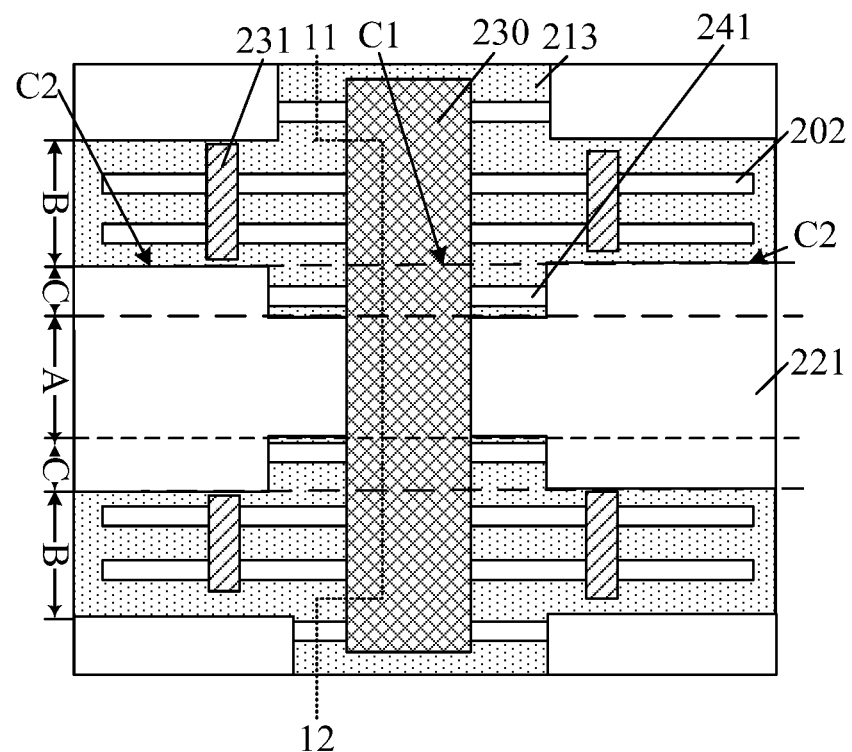
Figure 17:
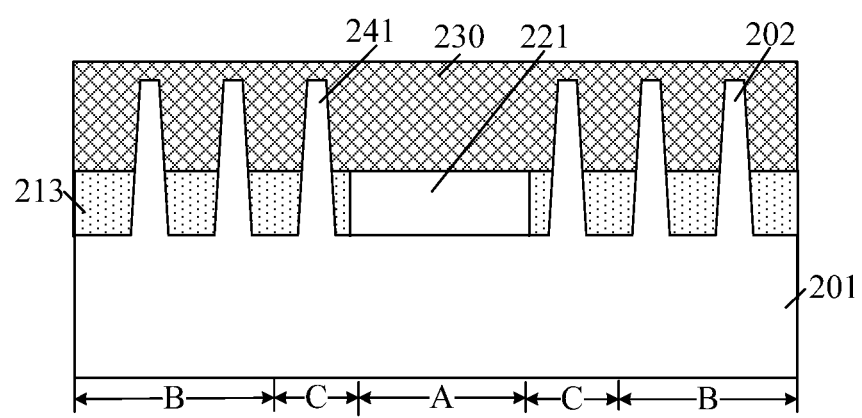

Further, returning to FIG. 24, a plurality of gate structures may be formed across the fin structures in the device region (S1106). FIG. 16 shows a schematic top view of a corresponding semiconductor structure developed from the structure shown in FIG. 13. FIG. 17 shows a schematic cross-section view of the semiconductor structure shown in FIG. 16 along line "11-12".

Referring to FIGS. 16-17, after forming the first isolation layer 221, a plurality of gate structures 230 may be formed across the fin structures 202 in the device region B. The plurality of gate structures 230 may cover a portion of the sidewall and the top surfaces of each fin structure 202.

In one embodiment, the gate structure 230 may also be formed across the plurality of dummy fin structures 241. In addition, a portion of the gate structure 230 may be formed on the surface of the first isolation layer 221.

In one embodiment, each gate structure 230 may include a gate dielectric layer formed across the plurality of fin structures 202 and a gate electrode formed on the gate dielectric layer. The gate dielectric layer may cover a portion of the sidewall and the top surfaces of each fin structure 202.

In one embodiment, the gate dielectric layer may be made of $SiO_x$. In other embodiments, the gate dielectric layer may also be made of a high-k (k>3.9) dielectric material including $HfO_2$, $La_2O_3$, HfSiON, $HfAlO_2$, $ZrO_2$, $Al_2O_3$, $HfSiO_4$, etc.

In one embodiment, the gate electrode may be made of polycrystalline silicon. In other embodiments, the gate electrode may also be made of a metal, including Al, Cu, Ag, Au, Ni, Ti, W, WN, WSi, etc.

Further, returning to FIG. 24, two doped source/drain regions may be formed in the fin structures on the two opposite sides of each gate structure in the device region (S1107). Referring to FIG. 16, in the device region B, two doped source/drain regions 231 may be formed in the fin structures 202 on the two opposite sides of the gate electrode.

In one embodiment, the process to form the doped source/drain regions 231 may include forming two trenches in the fin structures 202 on the two opposite sides of the gate structure 230 in the device region B and then forming the two doped source/drain regions 231 in the two trenches.

In one embodiment, the two doped source/drain regions 231 may be formed in the two trenches formed in the device region B through an epitaxial growth process.

Moreover, referring to FIG. 17, because the portion of the substrate 201 in each dummy source/drain region C2 may be covered by the first isolation layer 221, during the epitaxial growth process to form the doped source/drain regions 231, the doped source/drain regions 231 may not be formed on the two opposite sides of the gate structures 230 in each dummy gate region C1. Therefore, semiconductor devices incorporating the dummy fin structures 241 may not be formed, and thus the width of the dummy fin structures 241 may not be able to affect the performance of the formed semiconductor structure.

Further, although the disclosed method is illustrated based on fabrication of metal-oxide-semiconductor (MOS) transistors, the method may also apply to the fabrication of diodes or triodes.

For example, the dummy fin structures may be formed on the substrate in the transition region and the semiconductor device may include an N-type epitaxial layer formed on the fin structures in the first device region and a P-type epitaxial layer formed on the fin structures in the second device region. Moreover, the N-type epitaxial layer may include N-type doping ions and the P-type epitaxial layer may include P-type doping ions. The conduction types of the P-type doping ions and the N-type doping ions may be different, and the P-type epitaxial layer and the N-type epitaxial layer may be in contact with each other. Further, the dummy fin structures in the transition region may be exposed by the P-type epitaxial layer and the N-type epitaxial layer.

Figure 25:
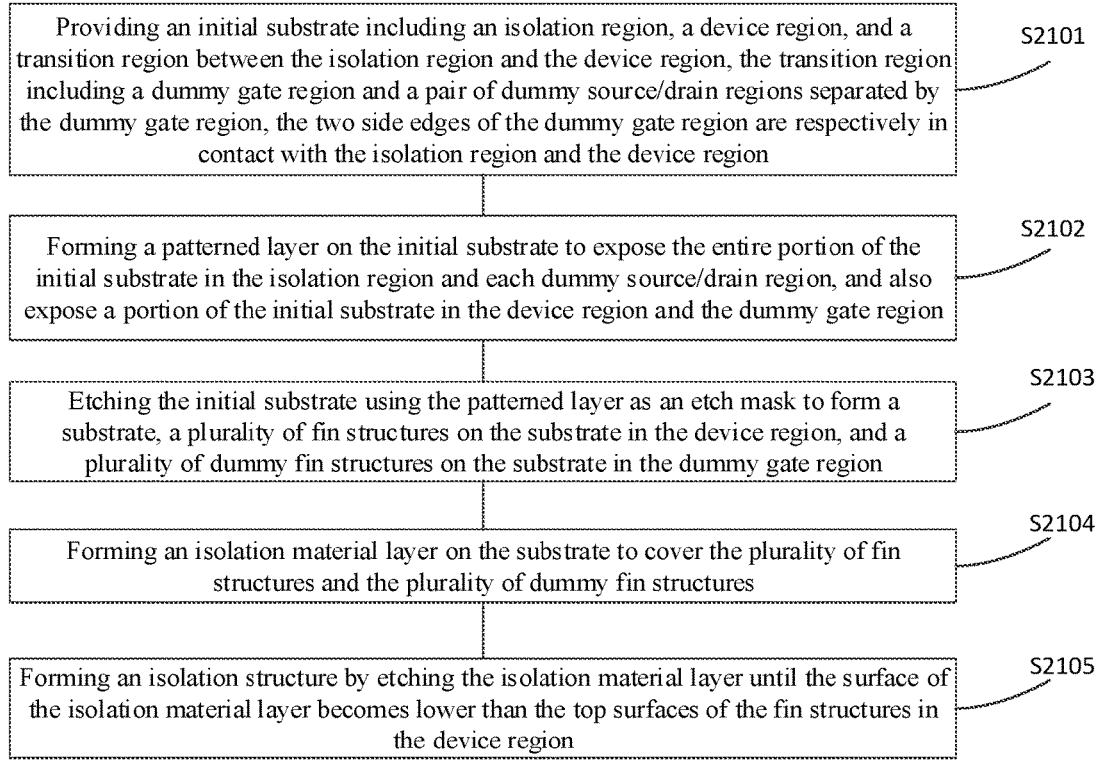
FIG. 25 illustrates a flowchart of another exemplary method for fabricating a semiconductor structure consistent with various disclosed embodiments in the present disclosure.

The present disclosure also provides another method for fabricating a semiconductor structure. FIG. 25 shows a flowchart of another exemplary method for fabricating a semiconductor structure consistent with various disclosed embodiments in the present disclosure. FIGS. 18-23 show schematic cross-section views of semiconductor structures at certain stages of the exemplary method.

Figure 18:
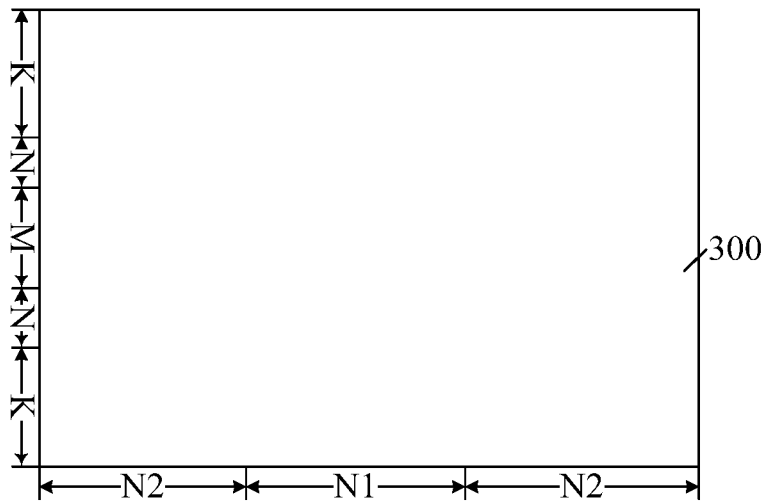
FIGS. 18-23 illustrate schematic cross-section views of semiconductor structures at certain stages of another exemplary fabrication method consistent with various disclosed embodiments in the present disclosure.

Referring to FIG. 25, at the beginning of the fabrication process, an initial substrate including an isolation region, a device region, and a transition region formed between the isolation region and the device region may be provided, and the transition region includes a dummy gate region and a pair of dummy source/drain regions separated by the dummy gate region (S2101). FIG. 18 shows a schematic top view of a corresponding semiconductor structure.

Referring to FIG. 18, an initial substrate 300 may be provided. The initial substrate 300 may include an isolation region M, a device region K, and a transition region N between the isolation region M and the device region K. In one embodiment, referring to FIG. 18, the device region K includes two discrete sub-regions, and the transition region N may also include two discrete sub-regions. In addition, each sub-region of the device region K is separated from the isolation region M by a sub-region of the transition region N. In other embodiments, the isolation region, the device region, and the transition region may each include a plurality of sub-regions as long as each sub-region of the device region is separated from the isolation region by the sub-regions of the transition region. In a specific embodiment, each of the isolation region, the device region, and the transition region may only include one sub-region.

In one embodiment, the transition region N may include one dummy gate region N1 and a pair of dummy source/drain regions N2 formed on the two opposite sides of the dummy gate region N1.

Further, referring to FIG. 25, a patterned layer may be formed on the initial substrate to expose the entire portion of the initial substrate in the isolation region and each dummy source/drain region and also expose a portion of the initial substrate in the device region and the dummy gate region (S2102). The position of the exposed portion of the initial substrate is schematically shown in FIG. 19.

Figure 19:
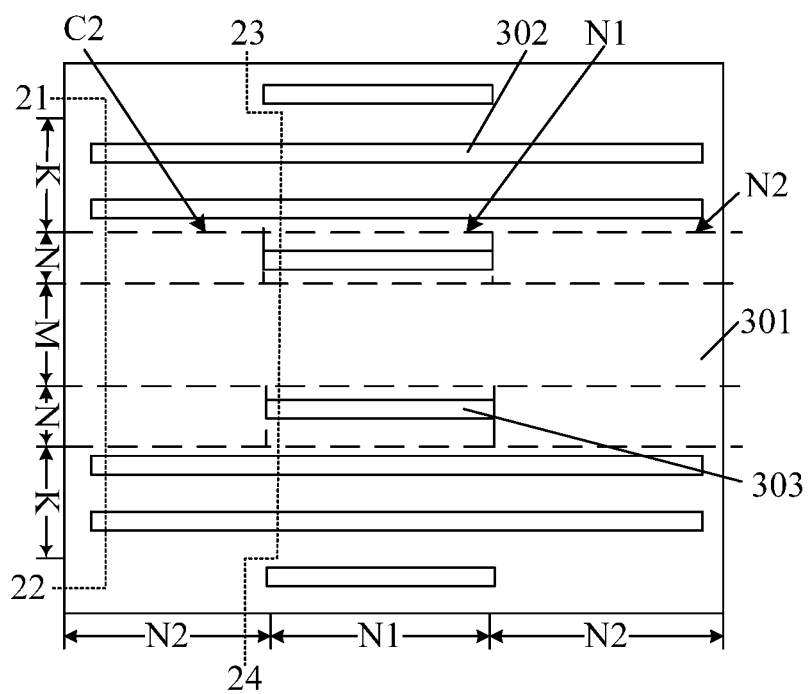

Referring to FIG. 19, a portion of the initial substrate 300 (referring to FIG. 18) may be exposed by a patterned layer (not shown) formed on the initial substrate 300. The patterned layer may not cover the entire portion of the substrate 300 in the isolation region M and the dummy source/drain regions N2. Moreover, the patterned layer may also expose a portion of the initial substrate 300 in the device region K and the dummy gate region N1.

The patterned layer may be used to define the widths and the positions for subsequently-formed fin structures and dummy fin structures. Specifically, the portion of the initial substrate 300 in the device region K covered by the patterned layer may define the top surfaces of subsequently-formed fin structures in the device region K, and the portion of the initial substrate 300 in the dummy gate region N1 covered by the patterned layer may define the top surfaces of subsequently-formed dummy fin structures in the dummy gate region N1.

In one embodiment, the patterned layer may be a patterned hard mask. In other embodiments, the patterned layer may also be a photoresist layer or an anti-reflective layer.

In one embodiment, the hard mask layer may be made of $SiO_x$. In other embodiments, the hard mask layer may be made of SiON.

Figure 20:
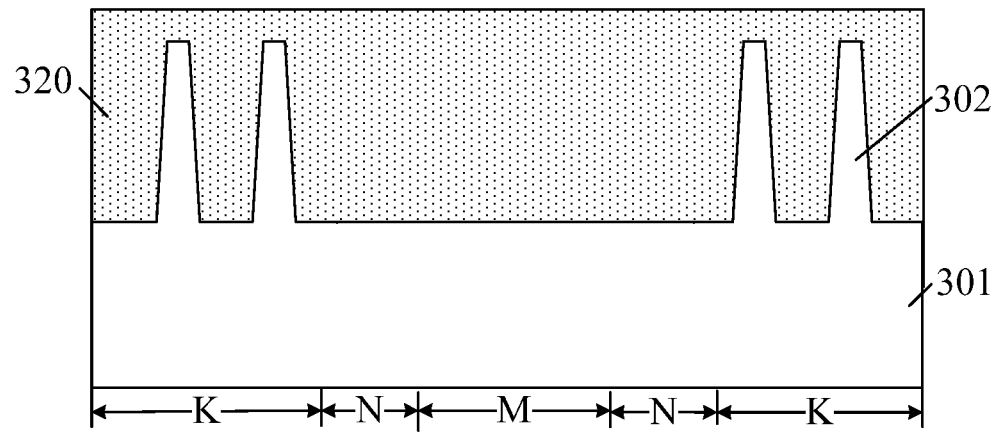
Figure 21:
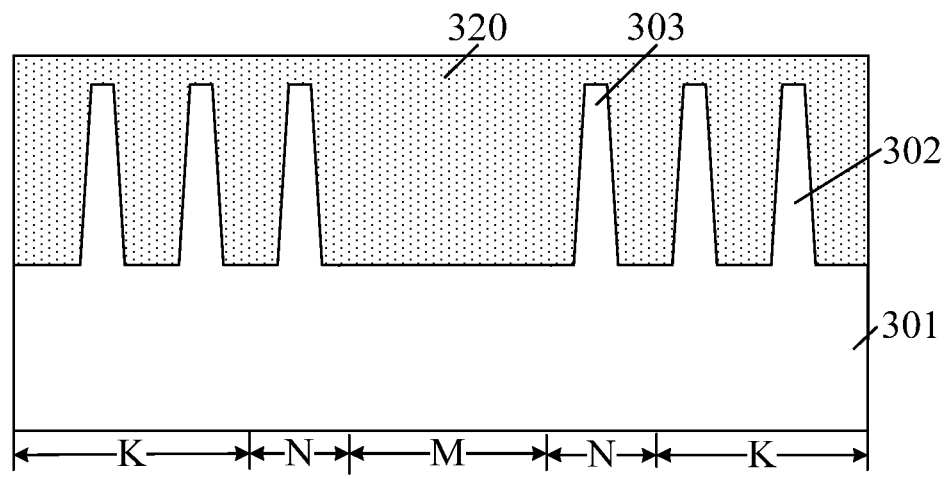

Further, returning to FIG. 25, an etching process using the patterned layer as an etch mask may be performed on the initial substrate to form a substrate, a plurality of fin structures on the substrate in the device region, and a plurality of dummy fin structures on the substrate in the dummy gate region (S2103). FIG. 19 shows a schematic top view of the corresponding semiconductor substrate with a substrate, a plurality of fin structures, and a plurality of dummy fin structures formed from the initial substrate. FIG. 20 shows a schematic cross-section view of the structure shown in FIG. 19 along line "21-22" with an isolation material layer formed on the top. FIG. 21 shows a schematic cross-section view of the structure shown in FIG. 19 along line "23-24" with an isolation material layer formed on the top.

Referring to FIGS. 19-21, the initial substrate 300 (referring to FIG. 18) may be etched using the patterned layer as an etch mask. After the etching process, a substrate 301, a plurality of fin structures 302, and a plurality of dummy fin structures 303 may be formed from the initial substrate 300. The plurality of fin structures 302 may be formed on the substrate 301 in the device region K, and the plurality of dummy fin structures 303 may be formed on the substrate 301 in the dummy gate region N1.

In one embodiment, the initial substrate 300 may be etched through a dry etching process. Specifically, such a dry etching process may demonstrate anisotropic etching effect and desired profile control. Therefore, the sidewalls of the fin structures 302 and the dummy fin structures 303 formed by a dry etching process may be perpendicular to the surface of the substrate 301 as desired. In other embodiments, the initial substrate may also be etched through a wet etching process or a process combining dry etching and wet etching.

In one embodiment, a plurality of dummy fin structures 203 may be formed on the substrate 301 in the dummy gate region N1. Further, the plurality of dummy fin structures 303 may prevent compounds produced during the process to etch the portion of the initial substrate 300 in the isolation region M from reaching the fin structures 302 formed in the adjacent device region K. Therefore, increase in the width of the fin structures 302 in the adjacent device region K during the etching process may be avoided. As such, the uniformity of the fin width of the fin structures 302 in the may be ensured, and thus the formation method may improve the performance of the formed semiconductor structure.

Moreover, in one embodiment, a plurality of dummy fin structures 303 may be formed on the substrate 301 in the dummy gate region N1. Further, during the process to etch the initial substrate 300, the plurality of dummy fin structures 303 may prevent the reactant from reaching the fin structures 302 formed in the adjacent device region K. Therefore, the influence of the reactant on the width of the fin structures 302 in the device region K may be reduced, and thus the uniformity of the fin width of the fin structures 302 may be improved.

In one embodiment, by forming a patterned layer on the initial substrate 300 and then using the patterned layer as an etch mask to etch the initial substrate 300, the plurality of fin structures 302 and the plurality of dummy fin structures 303 may be simultaneously formed. Therefore, the fabrication process may be simplified.

Further, returning to FIG. 25, an isolation material layer covering the plurality of fin structures and the plurality of dummy fin structures may be formed on the substrate (S2104). FIGS. 20-21 show schematic views of a corresponding semiconductor structure.

Referring to FIGS. 20-21, an isolation material layer 320 may be formed on the substrate 301 in the isolation region M, the device region K, as well as the transition region N. The top surface of the isolation material layer 320 may be higher than the top surfaces of the plurality of fin structures 302 and the plurality of dummy fin structures 303. That is, the isolation material layer 320 may cover the top and sidewall surfaces of the fin structures 302 and the dummy fin structures 303.

The isolation material layer 320 may be used to form a first isolation layer and a second isolation layer in a subsequent process.

In one embodiment, the isolation material layer 320 may be made of $SiO_x$. In other embodiments, the isolation material layer may be made of SiON.

In one embodiment, the isolation material layer 320 may be fabricated by a CVD process. Moreover, forming the isolation material layer 320 through a CVD process may further include forming a precursor on the substrate 301 in the isolation region M, the device region K, and the transition region N, and then performing an annealing process to activate the precursor and thus form the isolation material layer 320.

In one embodiment, the precursor may be flowable, e.g., in form of a fluid. Therefore, the formed isolation material layer 320 may be able to fully fill the gaps between neighboring fin structures 302 in the device region K. As such, the formed isolation material layer 320 may demonstrate desired isolation property.

In one embodiment, the precursor may be a material containing carbon-hydrogen bonds, carbon-oxygen bonds, and nitrogen-silicon bonds. Moreover, the reactant used in the annealing process to anneal the precursor may be an oxygen-containing gas including water vapor, oxygen gas, etc. During the annealing process, the oxygen atoms in the oxygen-containing gas may replace the nitrogen atoms and hydrogen atoms in the precursor, and thus form the isolation material layer 320.

Moreover, during the annealing process performed on the precursor, because the dummy fin structures may not be formed on the substrate 301 in the isolation region M, the portion of the isolation material layer 320 formed on the substrate 301 in the isolation region M may have a large area. Therefore, during the annealing process, the concentration of the oxygen-containing gas reaching the substrate 301 in the isolation region may be high, and thus the oxygen-containing gas may easily diffuse. Because of the presence of the transition region N between the device region K and the isolation region M and the formation of the dummy fin structures 303 on the substrate 301 in the dummy gate region N1, the oxygen-containing gas may not be able to easily reach the fin structures 302 formed in the device region K due to the blocking effect of the dummy fin structures 303. Therefore, the uniformity of the fin width of the fin structures 302 in the device region K may be ensured, and thus the performance of the formed semiconductor structure may be improved.

The dummy fin structures 303 may be made of silicon. The dummy fin structures 303 may react with the oxygen-containing gas such that the amount of the oxygen-containing gas reaching the fin structures 302 in the device region K may be reduced. Therefore, reduction of the width of the fin structures 302 adjacent to each transition region N may be suppressed.

Figure 22:
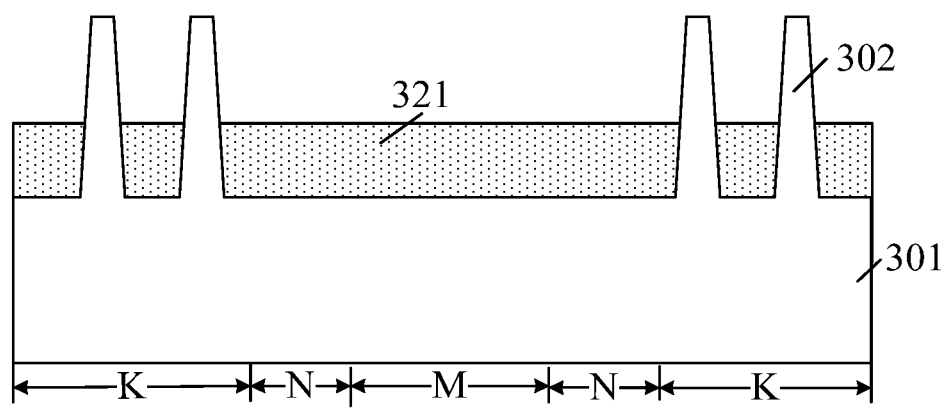
Figure 23:
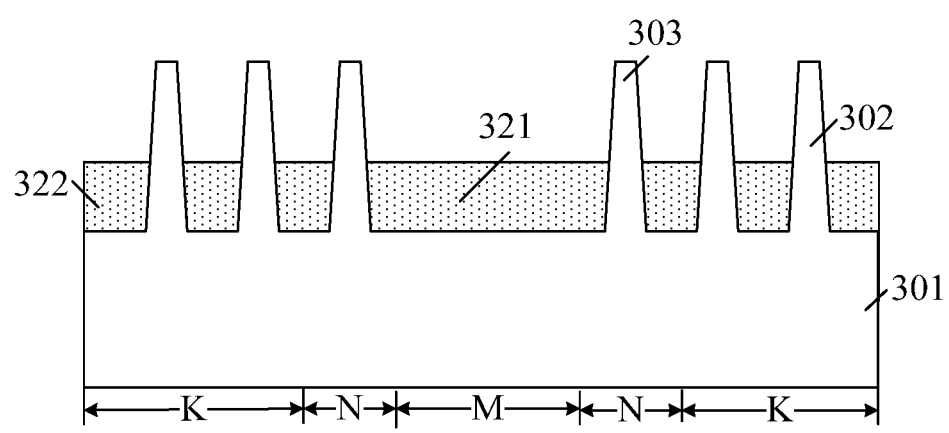

Further, returning to FIG. 25, an isolation structure may be formed by etching the isolation material layer until the surface of the isolation material layer becomes lower than the top surfaces of the fin structures in the device region (S2105). FIGS. 22-23 show schematic cross-section views of a corresponding semiconductor structure. Specifically, FIG. 22 shows a schematic cross-section view developed from the cross-section view shown in FIG. 20, and FIG. 23 shows a schematic cross-section view developed from the cross-section view shown in FIG. 21.

Referring to FIGS. 22-23, the isolation material layer 320 (referring to FIGS. 20-21) may be etched until the top surface of the isolation material layer 320 becomes lower than the top surfaces of the fin structures 302 in the device region K. As such an isolation structure 321 may be formed.

In one embodiment, the isolation material layer 320 may be etched by a dry etching process or a wet etching process.

According to the method for fabricating semiconductor structures described above, during the fabrication process, a plurality of dummy fin structures may be formed on the substrate in the transition region. Further, during the process to form a plurality of fin structures or form a first isolation layer, the dummy fin structures may prevent the reactant and the produced compound from reaching the fin structures in the adjacent device region. As such, during the process to form the fin structures or form the first isolation layer, the influence of the reactant and the produced compound on the width of the fin structures in the device regions may be reduced. Therefore, the uniformity of the fin width may be ensured, and thus the disclosed fabrication method may improve the performance of the formed semiconductor structure.

Further, the first isolation layer may cover the portion of the substrate in the dummy source/drain regions, and thus the dummy fin structures may not be formed in the dummy source/drain regions. Therefore, forming transistors from the dummy fin structures in the dummy source/drain regions may be avoided. As a result, the influence of the width of the dummy fin structures on the performance of the formed semiconductor devices may be reduced.

Further, the initial substrate may be patterned to form the plurality of fin structures and the plurality of dummy fin structures, and then the first isolation layer and the second isolation layer may be formed. As such, the fabrication process may be simplified and the product yield may be improved.

The present disclosure also provides a semiconductor structure. FIG. 16 shows a schematic top view of an exemplary semiconductor structure consistent with various embodiments of the present disclosure. FIG. 17 shows the schematic cross-section view of the structure shown in FIG. 16 along line "11-12".

Referring to FIGS. 16-17, the semiconductor structure may include an isolation region A, a device region B, and a transition region C between the isolation region A and the device region B. In addition, the semiconductor structure may include a plurality of fin structures 202 formed on a substrate 201 in the device region B, a plurality of dummy fin structures 241 formed on the substrate 201 in the transition region C, and an isolation structure formed on the substrate 201 in the isolation region A, the device region B, and the transition region C. The semiconductor structure may also include a plurality of semiconductor devices formed on the fin structures 202 in the device region B.

In one embodiment, referring to FIGS. 16-17, the device region B includes two discrete sub-regions, and the transition region C includes two discrete sub-regions. In addition, each sub-region of the device region B is separated from the isolation region A by a sub-region of the transition region C. In other embodiments, the isolation region, the device region, and the transition region may each include a plurality of sub-regions as long as each sub-region of the device region is separated from the isolation region by the sub-regions of the transition region. In a specific embodiment, each of the isolation region, the device region, and the transition region may only include one sub-region.

In one embodiment, the isolation region A may be used to electrically isolate neighboring sub-regions of the device region B. Further, the transition region C may be used to form the plurality of dummy fin structures 241 to provide protection for the plurality of fin structures 202 in the device region B during the fabrication process.

Further, each sub-region of the transition region C may include a dummy gate region C1 and a pair of dummy source/drain regions C2 separated by the dummy gate region C1. The two side edges of the dummy gate region C1 may be in contact with the isolation region A and the device region B, respectively. In other embodiments, the transition region may not include the dummy gate region.

In one embodiment, the plurality of dummy fin structures 241 may be formed on the substrate 201 in the dummy gate region C1. In other embodiments, the dummy fin structures may also be formed on the substrate in the dummy source/drain regions.

In one embodiment, the isolation region A may electrically isolate the sub-regions of the device region B. Further, each transition region C may electrically isolate the isolation region A from the device region B, and thus provide protection for the fin structures formed in the device region B.

In one embodiment, the substrate 201, the plurality fin structures 202, and the plurality of dummy fin structures 241 may be made of a same material. For example, the substrate 201, the plurality fin structures 202, and the plurality of dummy fin structures 241 may be made of silicon. In other embodiments, the substrate 201, the plurality fin structures 202, and the plurality of dummy fin structures 241 may be made of germanium, SiGe, silicon on insulator (SOI), germanium on insulator (GOI), or any other appropriate material.

Further, a plurality of dummy fin structures 241 may be formed on the substrate 201 in the dummy gate region C1. The plurality of dummy fin structures 241 may isolate the adjacent fin structures 202 in the device region B from the isolation region A, and thus provide protection for the fin structures 202 in the device region B. Therefore, change in the width of the fin structures 202 in the device region B may be suppressed. As such, the uniformity of the width of the fin structures 202 in the semiconductor structure may be improved and the performance of the formed semiconductor structure may also be improved.

Moreover, the dummy fin structures 241 may not be formed on the substrate 201 in the dummy source/drain regions C2 such that forming transistors from the dummy fin structures 241 in the dummy source/drain regions C2 may be avoided. Therefore, the influence of the width of the dummy fin structures 241 on the performance of the formed semiconductor structure may be reduced.

In one embodiment, the plurality of fin structures 202 and the plurality of dummy fin structures 241 may be made of a same material. As such, the plurality of dummy fin structures 241 may easily react with the reactant gas which reacts with the fin structures 202 and affects the fin width of the fin structures 202. Therefore, the presence of the plurality of dummy fin structures 241 may prevent the reactant gas from reaching the fin structures 202 in the transition region C. With the amount of the reactant gas reaching the fin structures 202 in the transition region C reduced, reduction of the width of the fin structures 202 in the transition region C may be suppressed, and thus the uniformity of the width of the fin structures 202 may be ensured.

In other embodiments, the fin structures and the dummy fin structures may be made of different materials.

In one embodiment, the number of the dummy fin structures 241 may be one or more than one.

In one embodiment, the isolation structure may include a first isolation layer 221 formed on the portion of the substrate 201 in the isolation region A and the dummy source/drain regions C1, and a second isolation layer 213 formed on the portion of the substrate 201 in the device region B and the dummy gate region C1. Moreover, the top surface of the second isolation region 213 may be below the top surfaces of the fin structures 202.

The second isolation layer 213 may be used to electrically isolate neighboring fin structures 202, while the first isolation layer 221 may be used to electrically isolate neighboring sub-regions of the device region B.

In one embodiment, the first isolation layer 221 and the second isolation layer 213 may be formed by a same material. For example, the first isolation layer 221 and the second isolation layer 213 may be both formed by $SiO_x$. In other embodiments, the first isolation layer and the second isolation layer may be made of different materials.

In one embodiment, the semiconductor structure may further include a plurality of gate structures 230 formed across the plurality of fin structures 202 in the device region B and two doped source/drain regions 231 formed in the fin structures 202 on the two opposite sides of each gate structure 230 in the device region B. Moreover, each gate structure 230 may cover a portion of the top and the sidewall surfaces of the fin structures 202 in the device region B. In other embodiments, the transition region may not include the dummy gate region; accordingly, the semiconductor structure may not include the gate structures.

In one embodiment, the gate structures 230 may also be formed across the plurality of dummy fin structures 241. In addition, a portion of the gate structures 230 may be formed on the surface of the first isolation layer 221.

In one embodiment, each gate structure 230 may further include a gate dielectric layer formed across the plurality of fin structures and a gate electrode formed on the gate dielectric layer. The gate dielectric layer may cover a portion of the top and the sidewall surfaces of the fin structures 202.

In one embodiment, the gate dielectric layer may be made of $SiO_x$. In other embodiments, the gate dielectric layer may be made of a high-k (k>3.9) dielectric material including $HfO_2$, $La_2O_3$, HfSiON, $HfAlO_2$, $ZrO_2$, $Al_2O_3$, $HfSiO_4$, etc.

In one embodiment, the gate electrode may be made of polycrystalline silicon. In other embodiments, the gate electrode may also be made of a metal, including Al, Cu, Ag, Au, Ni, Ti, W, WN, WSi, etc.

In one embodiment, the doped source/drain regions 231 may not be formed on the two opposite sides of the gate structures 230 in the dummy gate region C1. Therefore, semiconductor devices incorporating the dummy fin structures 241 may not be formed, and thus the width of the dummy fin structures 241 may not be able to affect the performance of the formed semiconductor structure.

Further, although the disclosed semiconductor structure is illustrated based on structures of metal-oxide-semiconductor (MOS) transistors, with a plurality of dummy fin structures formed on the substrate in the transition region, the semiconductor structure may also be diodes or triodes.

For example, the semiconductor device may include an N-type epitaxial layer formed on the fin structures in the first sub-region of the device region and a P-type epitaxial layer formed on the fin structures in the second sub-region of the device region. Moreover, the N-type epitaxial layer may include N-type doping ions and the P-type epitaxial layer may include P-type doping ions. The conduction types of the P-type doping ions and the N-type doping ions may be different and the P-type epitaxial layer and the N-type epitaxial layer may be in contact with each other. Further, the dummy fin structures in the transition region may be exposed by the P-type epitaxial layer and the N-type epitaxial layer.

Compared to conventional fabrication methods and semiconductor structures, the disclosed fabrication methods and semiconductor structures may demonstrate several advantages.

According to the disclosed methods for fabricating semiconductor structures, during the fabrication process, a plurality of dummy fin structures may be formed on the substrate in the transition region. Further, during the process to form a plurality of fin structures or form a first isolation layer, the dummy fin structures may prevent the reactant and the produced compound from reaching the fin structures in the adjacent device region. As such, during the process to form the fin structures or form the first isolation layer, the influence of the reactant and the produced compound on the width of the fin structures in the device region may be reduced or eliminated. Therefore, the uniformity of the fin width may be ensured, and thus the disclosed fabrication method may improve the performance of the formed semiconductor structure.

Further, the first isolation layer may cover the portion of the substrate in the dummy source/drain regions, and thus the dummy fin structures may not be formed in the dummy source/drain regions. Therefore, forming transistors from the dummy fin structures in the dummy source/drain regions may be avoided. As a result, the influence of the width of the dummy fin structures on the performance of the formed semiconductor devices may be reduced.

Further, the initial substrate may be patterned to form the plurality of fin structures and the plurality of dummy fin structures, and then the first isolation layer and the second isolation layer may be formed. As such, the fabrication process may be simplified and the product yield may be improved.

Further, after forming the isolation material layer, the portion of the initial fin structures formed in the isolation region may be removed and then a first isolation layer may be formed in the first trench and the second trench. Therefore, the uniformity of the thickness of the first isolation layer in the isolation region may be ensured. As such, the isolation properties of the first isolation layer may be ensured and the performance of the formed semiconductor structure may be improved.

Further the plurality of fin structures and the plurality of dummy fin structures may be made of a same material. As such, the plurality of dummy fin structures may easily react with the reactant gas which reacts with the fin structures and affects the fin width of the fin structures. Therefore, the presence of the plurality of dummy fin structures may prevent the reactant gas from reaching the fin structures in the transition region. With the amount of the reactant gas reaching the fin structures in the transition region reduced, reduction of the width of the fin structures in the transition region may be suppressed, and thus the uniformity of the width of the fin structures may be improved.

Further, the first initial isolation layer and the second initial isolation layer may be made of a same material, and thus the first initial isolation layer and the second initial isolation layer may be etched by a single etching process. Therefore, the fabrication process may be simplified and the product yield may also be improved.

According to the disclosed semiconductor structures, a plurality of dummy fin structures may be formed on the substrate in the transition region. The dummy fin structures may isolate the fin structures in the adjacent device region from the isolation region, and thus provide protection for the fin structures in the device region. As such, change in the fin width of the fin structures in the device region may be suppressed. Therefore, the uniformity of the fin width of the fin structures in the formed semiconductor structure may be improved, and the performance of the formed semiconductor structure may also be improved.

Further, the first isolation layer may cover the portion of the substrate in the dummy source/drain regions. In addition, the dummy fin structures may not be formed on the substrate in the source/drain regions. Therefore, forming transistors from the dummy fin structures in the dummy source/drain regions may be avoided, and the influence of the width of the dummy fin structures on the semiconductor structure may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate including a device region, an isolation region, and a transition region sandwiched by the device region and the isolation region;
   forming a plurality of fin structures on the device region of the substrate;
   forming a plurality of dummy fin structures on the transition region of the substrate, wherein the plurality of dummy fin structures and the plurality of fin structures have a same height;
   forming an isolation structure on the device region, the isolation region, and the transition region of the substrate, wherein the isolation structure further covers a portion of sidewall surfaces of the fin structures and the dummy fin structures; and
   forming a plurality of semiconductor devices on the fin structures in the device region after forming the isolation structure.

2. The method for fabricating the semiconductor structure according to claim 1,
   wherein:
   the device region includes two discrete sub-regions;
   the transition region includes two discrete sub-regions; and
   each sub-region of the device region is separated from the isolation region by a sub-region of the transition region.

3. The method for fabricating the semiconductor structure according to claim 1,
   wherein:
   the transition region includes a dummy gate region and dummy source/drain regions separated by the dummy gate region;

the dummy gate region has one side edge in contact with the device region and another side edge in contact with the isolation region; and the plurality of dummy fin structures are formed on the substrate in the dummy gate region.

4. The method for fabricating the semiconductor structure according to claim 3, wherein forming the substrate, the plurality of fin structures, and the plurality of dummy fin structures includes:

providing an initial substrate;

forming a patterned layer on the initial substrate to expose an entire portion of the initial substrate in the isolation region and the dummy source/drain regions and also expose a portion of the initial substrate in the device region and the dummy gate region; and etching the initial substrate using the patterned layer as an etch mask to form the substrate, the plurality of fin structures on the substrate in the device region, and the plurality of dummy fin structures on the substrate in the dummy gate region.

5. The method for fabricating the semiconductor structure according to claim 4, wherein forming the isolation structure includes:

forming an isolation material layer on the substrate in the device region, the isolation region, and the transition region, wherein the isolation material layer covers sidewall surfaces of the fin structures and the dummy fin structures, and a top surface of the isolation material layer is higher than top surfaces of the fin structures and the dummy fin structures; and forming the isolation structure by etching the isolation material layer until the top surface of the isolation material layer becomes lower than the top surfaces of the fin structures in the device region.

6. The method for fabricating the semiconductor structure according to claim 3, wherein forming the substrate, the plurality of fin structures, and the plurality of dummy fin structures includes:

forming a base structure including the substrate, the plurality of fin structures on the substrate in the device region, and a plurality of initial fin structures on the substrate in the transition region and the isolation region; and removing a portion of the initial fin structures formed on the substrate in the isolation region and the dummy source/drain regions, wherein a remaining portion of the initial fin structures on the substrate in the dummy gate region becomes the plurality of dummy fin structures.

7. The method for fabricating the semiconductor structure according to claim 6, after forming the plurality of initial fin structures, further including:

forming a second initial isolation layer on the substrate in the dummy gate region and the device region, wherein the second initial isolation layer covers the sidewall surfaces of the fin structures and the dummy fin structures.

8. The method for fabricating the semiconductor structure according to claim 7, wherein forming the second isolation layer and removing the portion of the initial fin structures formed on the substrate in the isolation region and the dummy source/drain regions includes:

forming an isolation material layer on the substrate in the device region, the isolation region, and the transition region, wherein the isolation material layer covers the sidewall surfaces of the fin structures and the initial fin structures, and a top surface of the isolation material layer is higher than the top surfaces of the fin structures and the initial fin structures;

removing the initial fin structures and the isolation material layer formed in the isolation region to form a first trench in the isolation region; and removing the initial fin structures and the isolation material layer formed in each dummy source/drain region to form a second trench in the dummy source/drain region, wherein a plurality of dummy fin structures are formed in each dummy gate region, and a second initial isolation layer is formed on the substrate in the dummy gate region and the device region to cover the sidewall surfaces of the fin structures and the dummy fin structures.

9. The method for fabricating the semiconductor structure according to claim 8, wherein forming the isolation structure on the substrate in the device region, the isolation region, and the transition region includes:

forming a first initial isolation layer in the first trench and also the second trench;

forming a first isolation layer and a second isolation layer by etching the first initial isolation layer and the second initial isolation layer until the top surface of the second initial isolation layer becomes lower than the top surfaces of the fin structures; and the first isolation layer and the second isolation layer together form the isolation structure.

10. The method for fabricating the semiconductor structure according to claim 9, wherein the first isolation layer and the second isolation layer are made of a same material including $SiO_x$ and SiON; and the portion of the initial fin structures formed in the dummy source/drain regions and the isolation region is removed by one of a dry etching process and a wet etching process.

11. The method for fabricating the semiconductor structure according to claim 6, wherein forming the base structure includes:

providing an initial substrate; and patterning the initial substrate to form the substrate, the plurality of fin structures on the substrate in the device region, and a plurality of dummy fin structures on the substrate in the transition region and the isolation region.

12. The method for fabricating the semiconductor structure according to claim 1, wherein the plurality of fin structures and the plurality of dummy fin structures are made of a same material including silicon, germanium, and SiGe.

13. The method for fabricating the semiconductor structure according to claim 1, further including:

forming a plurality of gate structures across the plurality of fin structures in the device region, wherein each gate structure is formed on a portion of sidewall and top surfaces of the plurality of fin structures in the device region; and forming source/drain regions in the fin structures on two opposite sides of each gate structure in the device region.

14. The method for fabricating the semiconductor structure according to claim 13, wherein each gate structure also covers a portion of the isolation structure.

15. A semiconductor structure, comprising:
a substrate including a device region, an isolation region, and a transition region sandwiched by the device region and the isolation region;
a plurality of fin structures formed on the substrate in the device region of the substrate;
a plurality of dummy fin structures formed on the substrate in the transition region of the substrate, wherein the plurality of dummy fin structures and the plurality of fin structures have a same height;
an isolation structure formed on the device region, the isolation region, and the transition region of the substrate, wherein the isolation structure further covers a portion of sidewall surfaces of the fin structures and the dummy fin structures; and
a plurality of semiconductor devices formed on the fin structures in the device regions.

16. The semiconductor structure according to claim 15, wherein:
the device region includes two discrete sub-regions;
the transition region includes two discrete sub-regions; and
each sub-region of the device region is separated from the isolation region by a sub-region of the transition region.

17. The semiconductor structure according to claim 15, further including:
a plurality of gate structures formed across the plurality of fin structures in the device region, wherein each gate structure is formed on a portion of sidewall and top surfaces of the plurality of fin structures in the device region; and
source/drain regions in the fin structures on two opposite sides of each gate structure in the device region.

18. A semiconductor structure, comprising:
a substrate including a device region, an isolation region, and a transition region between the device region and the isolation region;
a plurality of fin structures formed on the substrate in the device region of the substrate;
a plurality of dummy fin structures formed on the substrate in the transition region of the substrate;
an isolation structure formed on the device region, the isolation region, and the transition region of the substrate, wherein the isolation structure further covers a portion of sidewall surfaces of the fin structures and the dummy fin structures; and
a plurality of semiconductor devices formed on the fin structures in the device regions,
wherein:
the transition region includes a dummy gate region and dummy source/drain regions formed on two opposite sides of the dummy gate region;
one side edge of the dummy gate region is in contact with the isolation region and another side edge of the dummy gate region is in contact with the device region; and
the plurality of dummy fin structures are formed on the substrate in the dummy gate region.

19. The semiconductor structure according to claim 18, wherein the isolation structure includes:
a first isolation layer formed on the substrate in the isolation region and the dummy source/drain regions; and
a second isolation layer formed on the substrate in the device region and the dummy source/drain regions, wherein a top surface of the second isolation layer is lower than top surfaces of the fin structures.

20. The semiconductor structure according to claim 19, wherein:
the first isolation layer and the second isolation layer are made of a same material including $SiO_x$ and SiON; and
the plurality of fin structures and the plurality of dummy fin structures are made of a same material including silicon, germanium, and SiGe.

* * * * *